United States Patent
Male

(10) Patent No.: US 6,717,393 B2
(45) Date of Patent: Apr. 6, 2004

(54) SYSTEM FOR DIFFERENCE CALCULATION USING A QUAD SLOPE CONVERTER

(75) Inventor: Barry Jon Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 10/120,936

(22) Filed: Apr. 11, 2002

(65) Prior Publication Data

US 2003/0193324 A1 Oct. 16, 2003

(51) Int. Cl.$^7$ .......................... G01R 22/00; G01D 1/14; H03M 1/00; H03M 1/50
(52) U.S. Cl. ................. 324/76.17; 324/76.18; 341/168; 341/155; 341/126
(58) Field of Search ............. 324/76.18, 76.17, 324/76.11; 341/168, 126, 155

(56) References Cited

U.S. PATENT DOCUMENTS

| | | | | |
|---|---|---|---|---|
| 4,164,733 A | * | 8/1979 | Landsburg et al. | 341/118 |
| 5,565,869 A | * | 10/1996 | Brodie et al. | 341/168 |
| 6,597,183 B1 | * | 7/2003 | Male | 324/607 |
| 2003/0053587 A1 | * | 3/2003 | Demharter | 378/19 |

OTHER PUBLICATIONS

James R. Drummond, "Analogue–to–Digital Conversion" PHY 406F Microprocessor Interfacing Techniques. Sep. 1997, pp. 89–108.

Dallas Semiconductor Maxim, http://dbserv.maxim–ic.com/tarticle/view article.cfm?article id=14 Pipeline ADC s.

Come of Age Mar. 21, 2000, p. 1–13.

Phy 235 Lecture Notesm, "Lecture 15: Analog to Digital Converters", Spring 2001, pp. 15–1–15–11.

* cited by examiner

*Primary Examiner*—N. Le
*Assistant Examiner*—Donald M Lair
(74) *Attorney, Agent, or Firm*—W. Daniel Swayze, Jr.; W. James Brady; Frederick J. Telecky, Jr.

(57) ABSTRACT

A system for measuring signals in a non-linear network is provided which reduces the reliance on hardware and processing support when correcting for A/D offset by performing a pair of dual slope measurement cycles with an integrating analog to digital converter (ADC) circuit. Each of the measurement cycles has at least four phases including a first integrating phase and a first de-integrating phase followed by a second integrating phase and a second de-integrating phase. The system further includes an ADC controller operatively communicative with the integrating ADC circuit for detecting when the first count value is reached during the second de-integrating phase and then resetting the second count value in response to this detection so that the second count value is offset corrected at the end of the second de-integration phase. As a result, a difference calculation is automatically performed during the measurement cycle.

4 Claims, 4 Drawing Sheets

SYSTEM FOR DIFFERENCE CALCULATION USING A QUAD SLOPE CONVERTER

CROSS REFERENCE TO RELATED APPLICATIONS

This application is related to co-pending U.S. patent application Ser. No. 10/032,641 filed Dec. 28, 2001.

STATEMENT REGARDING FEDERALLY SPONSORED RESEARCH OR DEVELOPMENT

N/A

BACKGROUND OF THE INVENTION

Slope or integrating type analog to digital converters (ADCs) have typically been used for high precision averaging type measurements. Integrating ADCs are relatively slow devices having low input bandwidths but combine high resolution and low power consumption while advantageously utilizing the available speed. Additionally, ADCs are able to reject high-frequency noise and fixed low frequencies, which makes them useful in noisy industrial environments and applications where high update rates are not required, such as digitizing the outputs of strain gauges and thermocouplers.

An example of a conventional integrating ADC 100 is shown in FIG. 1. The integrating ADC 100 has two main sections which include an integrating portion 105 for acquiring and integrating an input voltage to produce an integrated voltage signal, and a counter 140 for translating the integrated voltage signal into a digital output value. The integrating portion 105 includes a first switch S1 for switching between an input voltage Vin and a reference voltage Vref. The first switch S1 is connected to an analog amplifier 110 through a resistor R. The output of the analog amplifier 110 is connected to a comparator 120. A capacitor C and a second switch S2 are connected in parallel across the analog amplifier 110. The output of the comparator 120 and a clock signal CLK are input to control logic 130. Responsive to these inputs, control signals from the control logic 130 control the first and second switches S1 and S2 for integrating the input voltage Vin during a fixed integrating time interval (Tcharge) and then de-integrating the reference voltage Vref until the output substantially reaches zero for a time interval (Tdischarge) as shown in FIG. 2.

In the integrating portion 105, the analog amplifier 110 charges the capacitor C with the input voltage Vin (first switch S1 is set to Vin). In the de-integrating portion, the analog amplifier 110 discharges the capacitor C with an opposite-polarity reference voltage Vref (first switch S1 is set to Vref). Vin is integrated for the fixed time interval Tcharge that corresponds to the maximum count of the counter 140. At the end of the fixed time interval Tcharge, the counter 140 is reset and Vref is applied to the input of the analog amplifier 110. The analog amplifier 110 then de-integrates until an output of zero is reached, which defines the end of the time interval Tdischarge, at which point in time the counter 140 is stopped and the analog amplifier 110 is reset (second switch S2 is momentarily closed).

Such ADCs are known to be used as a part of a data acquisition system for computer based systems. In addition to the ADC measurements, further calculations may be performed in the system to correct and improve the measurement accuracy thereof. One such calculation is to correct for a fixed offset in the signal being measured or an offset in the front end of the ADC. When correcting for fixed offsets in the signal being measured, the system can apply two levels of excitation to a device being measured, perform two A/D conversions and then calculate the difference between the two digital conversion values by using a dedicated hardware arithmetic logic unit (ALU) or a processor. One example of such a measurement is for a resistance having a diode or diodes in series therewith which are responsible for the offset.

When correcting for fixed offsets in the front end of the ADC, a zero input is applied, an A/D conversion is performed and then the unknown value is connected to the front end and a second A/D conversion is performed. The difference between the two digital conversion values represents the converted unknown value. Again, an ALU or processor is needed to perform these calculations.

After the offsets have been corrected, additional post processing may be performed to test the values against limits. Again, this can be done in a processor system or with dedicated registers and ALU operations in dedicated logic.

Correcting for ADC offsets in a separate processor or arithmetic logic may be infeasible in certain applications, or may unduly increase the cost and/or complexity of ADC-based measurement circuitry. A system is therefore desirable for eliminating the need for such dedicated ALU hardware or microprocessor/computer support for post processing and A/D offset correction.

BRIEF SUMMARY OF THE INVENTION

The present invention is directed to a system which reduces the reliance on hardware and processor support when correcting for A/D offset by performing a pair of dual slope measurement cycles with an integrating ADC. The integrating ADC performs an initial dual slope measurement cycle to obtain and store a count value, and this count value is then used during a second dual slope measurement to manipulate a counter. As a result of these measurements, the present system automatically performs a difference calculation on the count value during the second measurement cycle. The present system may also realize a direct comparison against limits during the second measurement which eliminates the need for additional hardware and processing support.

According to an embodiment of the present invention, a system is provided for measuring signals in a non-linear network by utilizing an integrating ADC circuit for performing dual slope measurement cycles. Each of the measurement cycles has at least four phases including a first integrating phase for integrating a first excitation voltage for a fixed time interval and generating a first integrated voltage, a first de-integrating phase for de-integrating the first integrated voltage until a predetermined threshold voltage is reached and generating a first digital output value, a second integrating phase for integrating a second excitation voltage for the fixed time interval and generating a second integrated voltage, and a second de-integrating phase for de-integrating the second integrated voltage until the predetermined threshold old voltage is reached and generating a second digital output value.

The system further includes an ADC controller operatively communicative with the integrating ADC circuit for obtaining and storing a first count value corresponding to the first digital output value at the end of the first de-integrating phase and obtaining a second count value corresponding to the second digital output value at the end of the second de-integrating phase. The ADC controller detects when the first count value is reached during the second de-integrating phase and resetting the second count value in response to detecting the first count value so that the second count value is offset corrected at the end of the second de-integration phase. As a result, the present invention eliminates the need of dedicated hardware and processing for offset correction and direct comparison against limits for achieving the integration of this system with reduced silicon area and complexity while maintaining performance accuracy.

Other aspects, features and advantages of the present invention are disclosed in the detailed description that follows.

BRIEF DESCRIPTION OF THE SEVERAL VIEWS OF THE DRAWING

The invention will be more fully understood by reference to the following detailed description of the invention in conjunction with the drawings, of which.

DETAILED DESCRIPTION OF THE INVENTION

Figure 1:
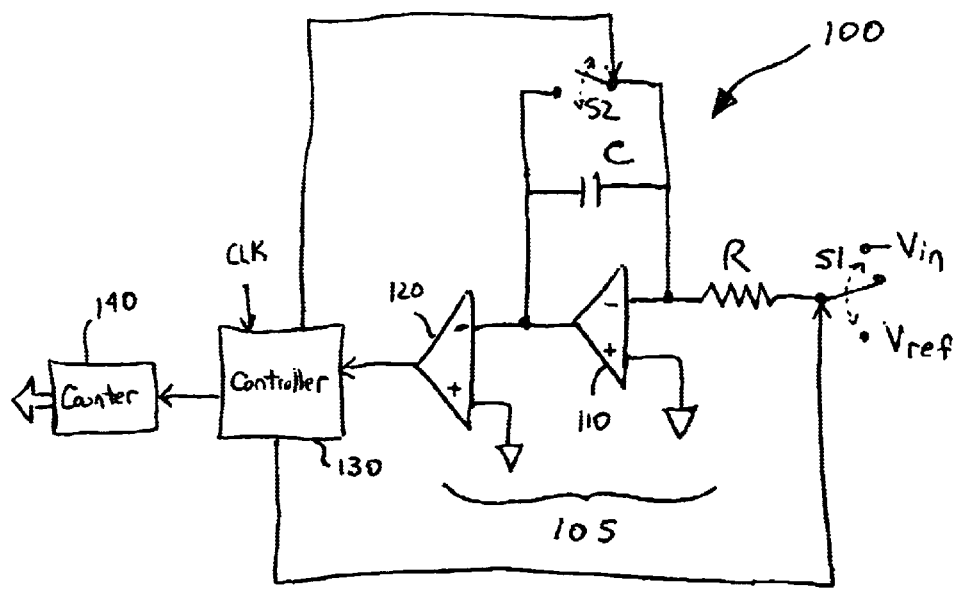
FIG. 1 illustrates a conventional integrating ADC.
Figure 2:
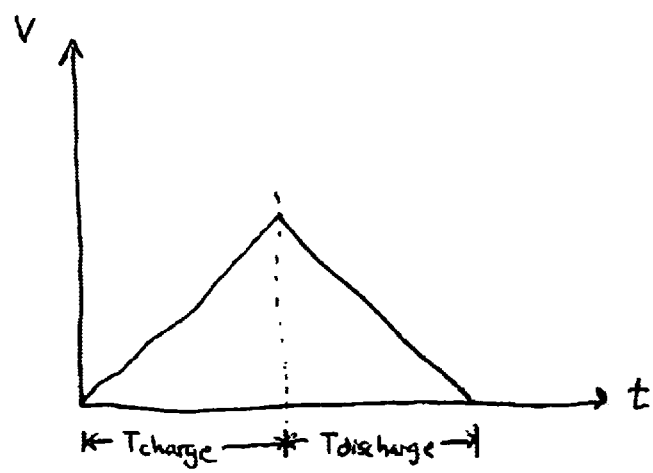
FIG. 2 illustrates a voltage waveform associated with the conventional integrating ADC.
Figure 3:
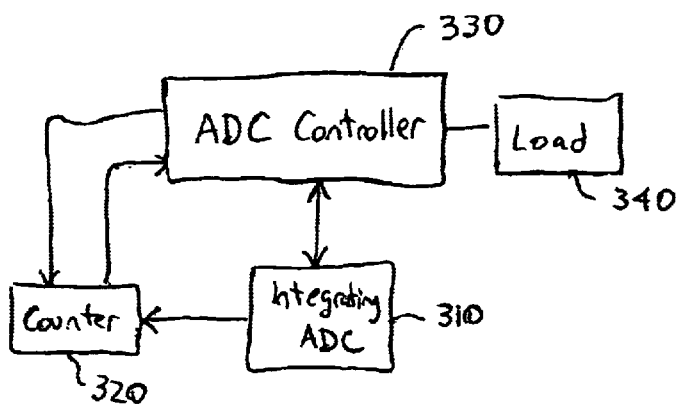
FIG. 3 illustrates a measurement system according to an embodiment of the present invention.

The embodiments of the present invention are directed to a system and method for measuring signals in a non-linear network. FIG. 3 illustrates a system according to an embodiment of the present invention which includes an integrating ADC circuit 310 for integrating and de-integrating input voltages, a counter 320 operatively communicative with the integrating ADC circuit 310 for outputting a digital output value of the integrated voltage, an ADC controller 330 operatively communicative with the integrating ADC circuit 310 and the counter 320 for performing control and measurement operations, and a load 340 connected to the ADC controller 330.

In particular, the ADC controller 330 performs dual slope measurement cycles in which first and second excitation voltages are sequentially inputted to the integrating ADC circuit 310 during dual slope measurement cycles. Within one dual slope measurement cycle, at least four measurement phase cycles are included. In a first phase, a first excitation voltage is input from the ADC controller 330 to the integrating ADC circuit 310 for generating a first integrated voltage after integrating the first excitation voltage for a fixed time interval. During the second phase of the measurement cycle, the integrating ADC circuit 310 de-integrates the first integrated voltage until a predetermined threshold voltage is reached and a first digital output value is generated. After the threshold voltage is reached, the counter 320 obtains a count value corresponding to a first digital output value which is then stored by the ADC controller 330 for use in subsequent phases.

In the third phase of the measurement cycle a second excitation voltage is input from the ADC controller 330 to the integrating ADC circuit 310 for generating a second integrated voltage after integrating the second excitation voltage for the fixed time interval. During the fourth measurement phase, the ADC controller 330 obtains a second count value corresponding to a second digital output value from the integrating ADC circuit 310 and compares the second count value with the stored first count value. When the ADC controller 330 determines that the second count value is equal to the first count value, the counter 320 is reset to zero. After being reset, the integrating ADC circuit 310 continues to de-integrate the second integrated voltage and the counter 320 resumes counting until the predetermined threshold voltage is reached. Thereby, at the end of this fourth measurement phase, the second count value is obtained with a difference calculation that has been automatically performed thereon.

Figure 4:
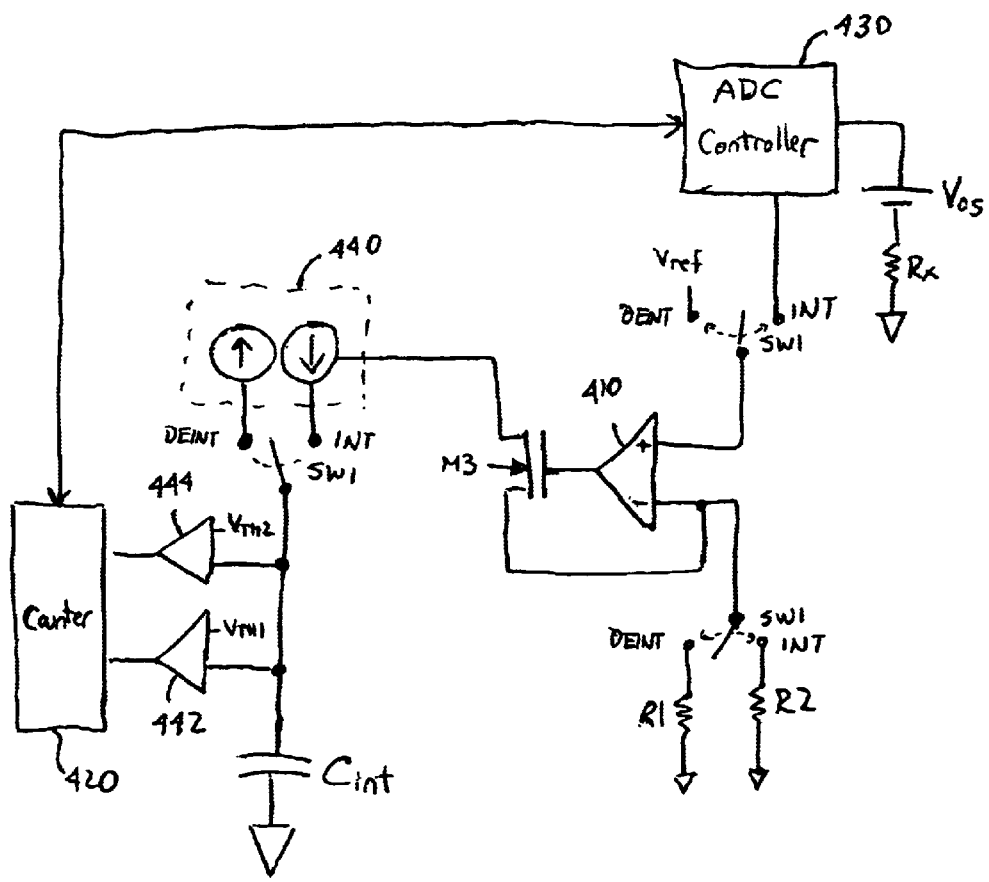
FIG. 4 illustrates the front end of an integrating ADC according to an embodiment of the present invention.

A detailed example of the specific circuitry that may be used in an embodiment of the present invention is shown in FIG. 4. An unknown load resistance Rx is to be measured which has an offset voltage Vos in series therewith. The offset voltage Vos may be generated, by one or more diodes for example. First and second excitation voltages Vex1 and Vex2 are sequentially generated by the ADC controller 430 so that excitation currents Iex1 and Iex2 respectively flow through the load. Typical values for the first and second excitation voltages may be 4V and 8V respectively in one example. During the integrating phases, the ADC controller 430 switches a switch SW1 to an integrating position (INT). In the integrating position INT, the switch SW1 connects the non-inverting input of an integrating amplifier 410 to the output voltage of the ADC controller 430 (the output voltages being proportional to the current flowing through the unknown load resistance Rx), and the inverting input of the integrating amplifier 410 to a resistor R2. Also, the switch SW1 is connected so that a positive current flows from a current mirror 440 and the output of the integrating amplifier 410 flows through a MOSFET M1 to an integrating capacitor Cint and first and second voltage threshold comparators 442 and 444. The integrating amplifier 410 controls the gate of a MOSFET M3 such that the current flowing through the resistor R2 is equivalent to that flowing into the drain of the MOSFET M3 and establishes the "set" current for the current mirror 440.

While in the de-integrating phases, the ADC controller 430 switches the switch SW1 to a de-integrating position (DEINT). In the de-integrating position DEINT, the switch SW1 connects the non-inverting input of the integrating amplifier 410 to a reference voltage Vref, the inverting input of the integrating amplifier 410 to a resistor R1, and a negative current flows from the current mirror 440. In one example of the present embodiment, the values of the resistors R1 and R2 are on the order of 100 kΩ for R1 and 25 kΩ for R2.

Figure 7:
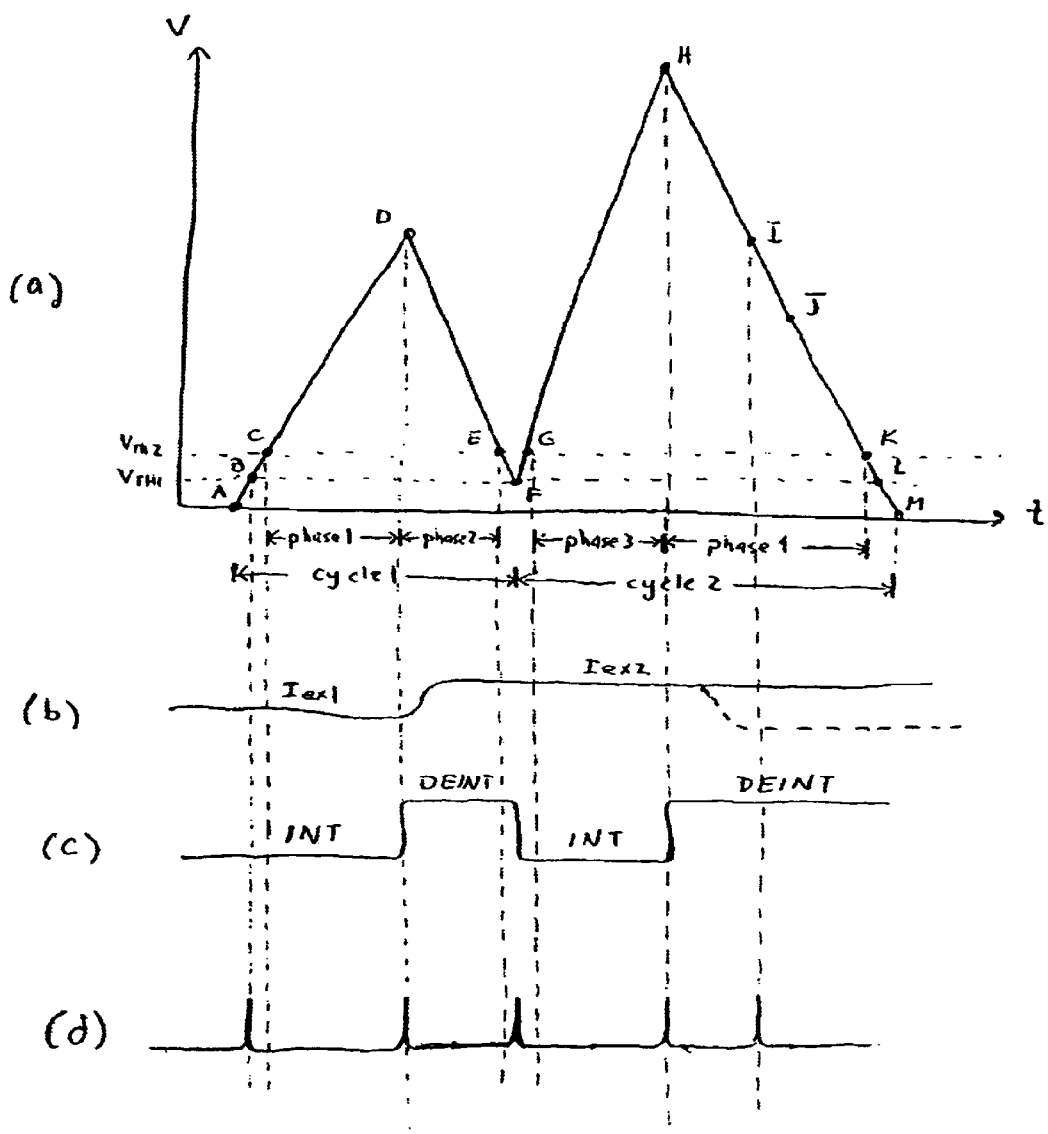
FIGS. 7(a)–7(d) illustrate waveforms associated with the measurement system according to an embodiment of the present invention.

An exemplary voltage waveform for the voltage produced by the integrator capacitor Cint during the phases of one measurement cycle is illustrated in FIG. 7(a). When the switch SW1 is first placed in the integrating position INT as illustrated in FIG. 7(c), the integrator capacitor Cint is charged from 0V for the fixed time interval with a current of ((Iex1×Rx)+Vos)/R2. The fixed time interval may correspond to a predetermined number of periods of a clock signal in the counter 420, such as 1024 counts.

After the ADC controller 430 detects that a first threshold voltage $V_{TH1}$ ($V_{TH1}$=0.25V for example) reached at point B, the counter 420 is reset by a reset signal as shown in FIG.

7(d). Next, the counter 420 starts to count when the voltage of the integrating capacitor Cint crosses the second threshold voltage $V_{TH2}$ ($V_{TH2}$=0.5V for example) at point C, and then stops counting at point D when the fixed time interval or the predetermined number of periods of the clock signal is reached. The ADC controller 430 then switches the switch SW1 to the de-integrating position DEINT and the current applied to the integrating capacitor Cint is reversed to a magnitude of Vref/R1. At point D, a reset signal is generated as shown in FIG. 7(d) and applied to the counter 420 for resetting the counter 420 and counting up from zero during the de-integration phase between points D and E. Also during the de-integration phase between points D and E, the second excitation voltage Vex2 is generated by the ADC controller 330 which increases the excitation current to the load resistance Rx from Iex1 to Iex2 as shown in FIG. 7(b) for the third phase.

When the ADC controller 430 detects that the voltage of the integrating capacitor Cint reaches the second threshold voltage $V_{TH2}$, the counter 420 is stopped so that a first count value is obtained which corresponds to the digital output value of the counter 420 at the end of the de-integration phase at points E. During the time between points E and F, the first count value is stored for subsequent use during the fourth measurement phase, a reset signal as shown in FIG. 7(d) is generated for resetting the counter 420, and the switch SW1 is switched to the integrating position INT as shown in FIG. 7(c). The current applied to the integrating capacitor Cint now becomes ((Iex2×Rx)+Vos)/R2. When the voltage of the integrating capacitor Cint reaches the second threshold voltage $V_{TH2}$ at point G, the counter 420 starts to count until the fixed time interval (for example, 1024 counts) is reached at point H as shown in FIG. 7(a).

At point H, the switch SW1 is switched to the de-integrating position DEINT as shown in FIG. 7(c) and the current applied to the integrating capacitor Cint is reversed to have a magnitude of Vref/R1. Also at this time, a reset signal is generated as shown in FIG. 7(d) for resetting the counter 420. During the de-integrating phase between points H and K, the ADC controller 430 compares the output of the counter 420 corresponding to the digital output value being generated with the stored first count value. When the present value of the counter 420 equals the stored first count value, shown as point I, a reset signal is generated as shown in FIG. 7(d) for resetting the counter 420. Thereafter, the counter 420 starts counting up again from zero until the second threshold voltage $V_{TH2}$ is reached at point K. As a result, the final count value obtained from the counter 320 at point K automatically has a difference calculation performed thereon which is equal to the difference between the first and second count values.

In performing this difference calculation, the first count value COUNT1 is obtained in the de-integration phase between points D and E, where COUNT1=(1024/Vref)×R1×((Iex1×Rx)+Vos)/R2. If the second count value COUNT2 were to continue for the entire de-integration phase between points H and K, the second count value would be determined from COUNT2=(1024/Vref)×R1×((Iex2×Rx)+Vos)/R2 and a difference value DELTACOUNT could be calculated in a processing step after point K by the equation DELTACOUNT=COUNT2−COUNT1. However, in the embodiments of the present invention, the second count value is reset a point I in order to eliminate this additional processing step. The difference calculation is automatically performed at point K due to resetting the second count value at point I, and the difference value corresponds to DELTACOUNT=(1024/Vref)×(R1/R2)×Rx×(Iex2−Iex1). It is noted that the values for the integrating capacitor Cint, the clock frequency, and the offset voltage Vos are not present in this equation.

In another embodiment of the present invention, a front end offset of the integrating ADC can be cancelled in a similar manner as performed by the system and method described above for FIG. 4 with the following modifications. Specifically, when the switch SW1 is switched to the integrating position INT during the first integrating phase (phase 1 in FIG. 7(a)), the non-inverting input to the integrating amplifier 410 is connected to ground. Also, when the switch SW1 is switched to the integrating position during the second integrating phase (phase 3 in FIG. 7(a)), the non-inverting input to the integrating amplifier 410 is connected to the unknown load Rx. All of the other inputs and connects remain the same as described for FIG. 4.

Figure 5:
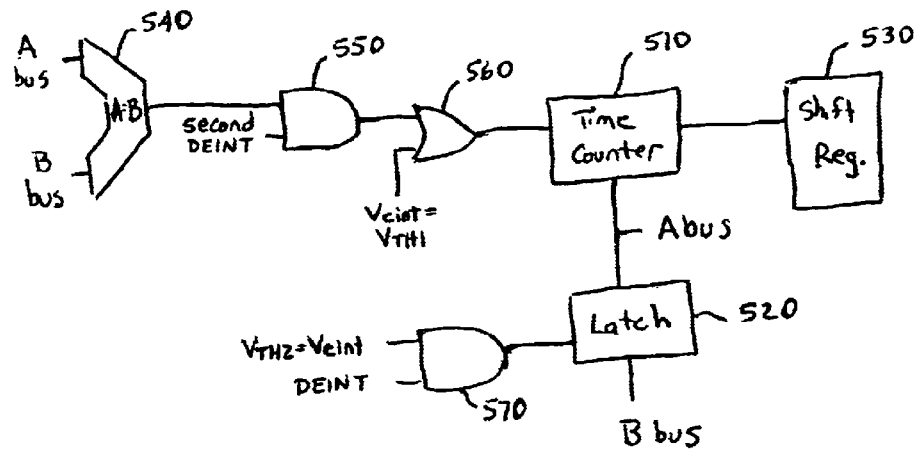
FIG. 5 illustrates control logic for a difference calculator of an integrating ADC according to an embodiment of the present invention.

FIG. 5 illustrates an example of specific circuitry and logic that may be used for resetting the count value according to an embodiment of the present invention. A time counter 510 is used for counting up to a fixed time or count value, for example 1024 counts, and is reset when the fixed time or count value is reached. The contents of the time counter 510 are stored in a latch 520 in response to the output of an AND gate 570 which detects during the de-integrating position DEINT when the voltage of the integrating capacitor Cint becomes equal to the second threshold voltage VTH2 as shown at points E and K in FIG. 7(a). For determining this condition the output of the time counter 510 is placed on a bus A and the output of latch 520 is placed on a bus B and then compared by a comparator 540. If the comparator 540 determines that the outputs of bus A and bus B are equal while in the second de-integration phase DEINT, an AND gate 550 outputs a signal to an OR gate 560 for resetting the time counter 510. This condition corresponds to point I in FIG. 7(a) where the counter 510 is reset on the fly so that the difference calculation is automatically performed.

Figure 6:
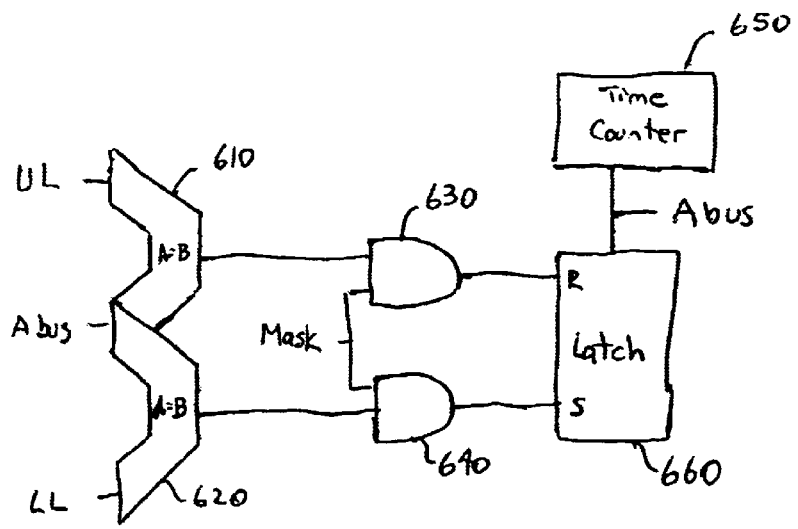
FIG. 6 illustrates a digital window limit comparator according to an embodiment of the present invention.

During the time between points I and K of the de-integration phase, digital window comparisons to predetermined values of upper limits (UL) and lower limits (LL) may be performed. Typically, a plurality of digital window comparators is used. One exemplary digital window comparator 600 is illustrated in FIG. 6. The output of a time counter 650 is placed on bus A which is input to both an upper limit compartor 610 and a lower limit comparator 620. The other inputs to the upper and lower limit comparators 610 and 620 are the UL and LL values respectively. If the lower limit comparator 620 determines that the count value from the time counter 650 on bus A equals the LL value and a mask signal is generated which indicates that the stored count value has been exceeded during the de-integration phase, an AND gate 640 generates a set signal for setting a latch 660. Such a condition may occur at point J in FIG. 7(a) for example. If the upper limit comparator 610 determines that the count value of the time counter 650 continues past the UL value, an AND gate 630 generates a reset signal for resetting the latch 660. As long as the output of the time counter 650 remains within an UL/LL window, the output of the corresponding window comparator is set and held. Accordingly, the present embodiment enables direct limit comparison.

The embodiments of the present invention provide significant simplification of ALU logic and eliminate the requirement of a dedicated CPU for performing offset correction for input signals containing a fixed offset. Also, hardware and processing for performing A/D front end offset correction for single non-offset input signals are simplified and eliminated. The embodiments of the present invention achieve these enhancements by directly performing difference calculations for these corrections during the fourth phase of the measurement cycles.

Significant simplification of ALU logic and processing which eliminates the requirement of a dedicated CPU to perform limit comparisons of the resulting corrected conversion is also realized in the embodiments of the present invention. The limit comparisons are performed on the fly during the fourth phase of the measurement cycles. As a result, A/D measurement accuracy with reduced complexity and lower silicon costs is achieved in comparison to conventional techniques.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A system for measuring signals in an non-linear network, comprising:
   an integrating analog to digital converter (ADC) circuit br performing measurement cycles, each of said measurement cycles having at least four phases including,
   a first integrating phase for integrating a first excitation voltage for a fixed time interval and generating a first integrated voltage,
   a first de-integrating phase for de-integrating said first integrated voltage until a predetermined threshold voltage is reached and generating a first digital output value,
   a second integrating phase for integrating a second excitation voltage for said fixed time interval and generating a second integrated voltage, and
   a second de-integrating phase for de-integrating said second integrated voltage until said predetermined threshold voltage is reached and generating a second digital output value;
   an ADC controller operatively communicative with said integrating ADC circuit for obtaining and storing a first count value corresponding to said first digital output value at the end of said first de-integrating phase and obtaining a second count value corresponding to said second digital output value at the end of said second de-integrating phase, said ADC controller detecting when said first count value is reached during said second de-integrating phase and resetting said second count value in response to detecting said first count value so that said second count value is offset corrected at the end of said second de-integration phase; and
   at least one window comparator for comparing said second count value with predetermined upper and lower limit values,
   wherein after said second count value is offset corrected, said window comparator generates a set signal for setting a latch when said second count value exceeds said predetermined lower limit value and a reset signal for resetting said latch when said second count value exceeds said predetermined upper limit value.

2. A system for measuring signals in a non-linear network, comprising:
   an integrating analog to digital converter (ADC) circuit for performing measurement cycles, each of said measurement cycles having at least four phases including,
   a first integrating chase for integrating a first excitation voltage for a fixed time interval and generating a first integrated voltage,
   a first de-integrating chase for de-integrating said first integrated voltage until a predetermined threshold voltage is reached and generating a first digital output value,
   a second integrating chase for integrating a second excitation voltage for said fixed time interval and generating a second integrated voltage, and
   a second de-integrating phase for de-integrating said second integrated voltage until said predetermined threshold voltage is reached and generating a second digital output value; and
   an ADC controller operatively communicative with said integrating ADC circuit for obtaining and storing a first count value corresponding to said first digital output value at the end of said first de-integrating phase and obtaining a second count value corresponding to said second digital output value at the end of said second de-integrating phase, said ADC controller detecting when said first count value is reached during said second de-integrating phase and resetting said second count value in response to detecting said first count value so that said second count value is offset corrected at the end of said second de-integration phase,
   wherein said integrating ADC circuit comprises an integrating amplifier with a MOSFET connected to the output of said integrating amplifier and said ADC controller and a resistor connected to the inputs of said integrating amplifier.

3. A system for measuring signals in a non-linear network, comprising:
   an integrating analog to digital converter (ADC) circuit for performing measurement cycles, each of said measurement cycles having at least tour phases including,
   a first integrating phase for integrating a first excitation voltage for a fixed time interval and generating a first integrated voltage,
   a first do-integrating phase for de-integrating said first integrated voltage until a predetermined threshold voltage is reached and generating a first digital output value,
   a second integrating phase for integrating a second excitation voltage for said fixed time interval and generating a second integrated voltage, and
   a second de-integrating phase for de-integrating said second integrated voltage until said predetermined threshold voltage is reached and generating a second digital output value; and
   an ADC controller operatively communicative with said integrating ADC circuit for obtaining and storing a first count value corresponding to said first digital output value at the end of said first de-integrating phase and obtaining a second count value corresponding to said second digital output value at the end of said second de-integrating phase, said ADC controller detecting when said first count value is reached during said second de-integrating phase and resetting said second count value in response to detecting said first count value so that said second count value is offset corrected at the end of said second de-integration phase,
   wherein said ADC controller comprises a current mirror source, first and second threshold comparators, a signal controller for switching said integrating ADC circuit between an integrating position and a de-integrating position, and a latch for storing said first count value.

4. A system for measuring signals according to claim 3, wherein said ADC controller further comprises a count comparator for comparing said second count value with the contents of said latch and storing said second count value in said latch when the contents of said latch are equal to said second count value during said de-integration phase.

* * * * *